United States Patent
Chen et al.

(10) Patent No.: US 11,010,583 B2
(45) Date of Patent: May 18, 2021

(54) DISPLAY PANEL AND DISPLAY APPARATUS

(71) Applicant: Shanghai Tianma AM-OLED Co., Ltd., Shanghai (CN)

(72) Inventors: Xian Chen, Shanghai (CN); Lijing Han, Shanghai (CN); Yueting Fang, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 131 days.

(21) Appl. No.: 16/234,699

(22) Filed: Dec. 28, 2018

(65) Prior Publication Data

US 2019/0392190 A1 Dec. 26, 2019

(30) Foreign Application Priority Data

Jun. 26, 2018 (CN) .......................... 201810672366.1

(51) Int. Cl.
| | |
|---|---|
| *G06K 9/00* | (2006.01) |
| *G09G 5/10* | (2006.01) |
| *H01L 27/32* | (2006.01) |
| *H01L 51/52* | (2006.01) |
| *H01L 27/146* | (2006.01) |

(52) U.S. Cl.
CPC ............. *G06K 9/0004* (2013.01); *G09G 5/10* (2013.01); *H01L 27/3234* (2013.01); *H01L 27/3262* (2013.01); *H01L 27/3265* (2013.01); *H01L 27/3276* (2013.01); *H01L 51/5218* (2013.01);
(Continued)

(58) Field of Classification Search
CPC .................. G06K 9/0004; G09G 5/10; G09G 2320/0626; H01L 27/323; H01L 27/3234; H01L 27/3248; H01L 27/3262; H01L 27/3265; H01L 27/3276; H01L 27/14678;
(Continued)

(56) References Cited

U.S. PATENT DOCUMENTS

| | | | |
|---|---|---|---|
| 2015/0102303 A1* | 4/2015 | Kim | ..................... H01L 27/3262 257/40 |
| 2017/0317155 A1* | 11/2017 | Oh | ....................... H01L 27/1255 |

(Continued)

FOREIGN PATENT DOCUMENTS

CN 105468187 A 4/2016

*Primary Examiner* — Kent W Chang
*Assistant Examiner* — Andrew Lee
(74) *Attorney, Agent, or Firm* — Tarolli, Sundheim, Covell & Tummino LLP

(57) ABSTRACT

The present disclosure provides a display panel, a display apparatus and a method for manufacturing the display panel. The display panel includes a driving circuit, a light-emitting device, and a fingerprint recognition unit. The light-emitting device includes a first electrode, a second electrode, and an organic function layer disposed between the first and second electrodes, and the first electrode is a reflective electrode. The driving circuit includes a light-emitting control transistor and a first initialization transistor that are connected to the first electrode via the first through-hole. The driving circuit includes at least a first driving circuit, and a minimum distance between the first through-hole of the first driving circuit and a first gate signal line connected to the first initialization transistor is smaller than a minimum distance between the first through-hole and a second gate signal line connected to the light-emitting control transistor.

19 Claims, 9 Drawing Sheets

(52) U.S. Cl.
CPC ........... *G09G 2320/0626* (2013.01); *H01L 27/14678* (2013.01); *H01L 2251/5392* (2013.01)

(58) Field of Classification Search
CPC ............ H01L 51/5203; H01L 51/5218; H01L 2251/5392; H01L 2227/323
See application file for complete search history.

(56) References Cited

U.S. PATENT DOCUMENTS

| | | | |
|---|---|---|---|
| 2018/0013093 A1* | 1/2018 | Park | H01L 27/326 |
| 2018/0211088 A1* | 7/2018 | Cho | G09G 5/00 |
| 2018/0321788 A1* | 11/2018 | Kimura | G02F 1/136213 |
| 2019/0131369 A1* | 5/2019 | Choi | H01L 27/3276 |

* cited by examiner

S101: manufacturing an inorganic layer by manes of vapor deposition

S102: coating a photoresist, exposing by means of a halftone mask, a semi-light-transmitting area of the halftone mask corresponding to a thinned area S103: developing by means of a developing solution S104: etching and stripping the photoresist, and forming the thinned area in the inorganic layer

FIG. 6A

DISPLAY PANEL AND DISPLAY APPARATUS

CROSS-REFERENCE TO RELATED APPLICATIONS

The present disclosure claims priority to Chinese Patent Application No. 201810672366.1, filed on Jun. 26, 2018, the content of which is incorporated herein by reference in its entirety.

TECHNICAL FIELD

The present disclosure relates to the field of display technologies, and in particular, to a display panel and a display apparatus.

BACKGROUND

At present, the full screen is favored by more and more consumers, and there is no more space for a fingerprint recognition module on the front side of the display apparatus. Therefore, the under-screen fingerprint recognition technology is used in the display apparatus. The under-screen fingerprint recognition can achieve fingerprint recognition on the front side, without occupying the space on the front side of the display apparatus. The principle of the under-screen fingerprint recognition is in that the display panel itself or the light source under the display panel emits light, and the light is reflected by finger to a photosensitive device for fingerprint recognition. However, in the display panel, there is a pixel circuit under each pixel for controlling light emission of the pixel and an opaque pixel electrode, so that the overall transmittance of the display panel is relatively low, so that the photosensitive device for the fingerprint recognition cannot receive sufficient light, thereby resulting in a low signal-to-noise ratio and an insensitive fingerprint recognition.

SUMMARY

In view of this, the present disclosure provides technical solutions to solve the above problem in the related art.

In a first aspect, the present disclosure provides a display panel. The display panel includes a plurality of driving circuits, a plurality of light-emitting devices, and a fingerprint recognition unit disposed at a side of the plurality of driving circuits facing away from the plurality of light-emitting devices. Each of the plurality of light-emitting devices includes a first electrode, a second electrode, and an organic function layer disposed between the first electrode and the second electrode. The first electrode is a reflective electrode. Each of the plurality of driving circuits includes a light-emitting control transistor and a first initialization transistor. Each of the plurality of driving circuits is provided with a first through hole, and the light-emitting control transistor and the first initialization transistor are connected to the first electrode via the first through-hole. The plurality of driving circuits includes a first driving circuit, and a minimum distance between a first through-hole of the first driving circuit and a first gate signal line connected to the first initialization transistor is smaller than a minimum distance between the first through-hole of the first driving circuit and a second gate signal line connected to the light-emitting control transistor.

In a second aspect, the present disclosure provides a display apparatus. The display apparatus includes the display panel according the first aspect, in which the fingerprint recognition unit includes a fingerprint recognition sensor, and the fingerprint recognition sensor is attached to a non-light-emitting side of the display panel.

In a third aspect, the present disclosure provides a display apparatus. The display apparatus includes a display panel. The display panel includes a plurality of driving circuits, a plurality of light-emitting devices, and a fingerprint recognition unit disposed at a side of the plurality of driving circuits facing away from the plurality of light-emitting devices. Each of the plurality of light-emitting devices includes a first electrode, a second electrode, and an organic function layer disposed between the first electrode and the second electrode. The first electrode is a reflective electrode. Each of the plurality of driving circuits includes a light-emitting control transistor and a first initialization transistor. Each of the plurality of driving circuits is provided with a first through hole, and the light-emitting control transistor and the first initialization transistor are connected to the first electrode via the first through-hole. The plurality of driving circuits includes a first driving circuit, and a minimum distance between a first through-hole of the first driving circuit and a first gate signal line connected to the first initialization transistor is smaller than a minimum distance between the first through-hole of the first driving circuit and a second gate signal line connected to the light-emitting control transistor. A distance between the first gate signal line connected to the first initialization transistor and the second gate signal line connected to the light-emitting control transistor is 20%-25% of a distance between pixels. In the display panel, the fingerprint recognition unit includes a fingerprint recognition sensor, and the fingerprint recognition sensor is attached to a non-light-emitting side of the display panel.

BRIEF DESCRIPTION OF DRAWINGS

In order to more clearly illustrate technical solutions in embodiments of the present disclosure, the accompanying drawings used in the embodiments are briefly introduced as follows. Obviously, the drawings described below are merely part of the embodiments of the present disclosure, other drawings can also be acquired by those skilled in the art without paying creative efforts.

FIGS. 6A-6D are schematic diagrams showing a process of manufacturing a display panel according to an embodiment of the present disclosure.

DESCRIPTION OF EMBODIMENTS

For better illustrating technical solutions of the present disclosure, embodiments of the present disclosure will be described in detail as follows with reference to the accompanying drawings.

It should be noted that the described embodiments are merely exemplary embodiments of the present disclosure, which shall not be interpreted as providing limitations to the present disclosure. All other embodiments obtained by those skilled in the art without creative efforts according to the embodiments of the present disclosure are within the scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used herein is merely an association relationship describing associated objects, indicating that there may be three relationships, for example, A and/or B may indicate that three cases, i.e., A existing individually, A and B existing simultaneously, B existing individually. In addition, the character "/" herein generally indicates that the related objects before and after the character form an "or" relationship.

At present, in order to comply with the trend of full screen, the under-screen fingerprint recognition become popular. In the conventional capacitive fingerprint recognition, the capacitance is greatly influenced by the distance, so that the capacitive fingerprint recognition is impossible by passing through the display panel. The optical fingerprint recognition is widely used because the transmission of light is less influenced by the distance. At present, the optical fingerprint recognition is performed as follows: the light emitted from a pixel in the screen or a light source under the screen reaches a human finger, and then is reflected to a fingerprint recognition unit for fingerprint recognition under the display panel. However, in the OLED display panel, the driving circuit and the pixel electrode are formed by opaque film layers, so that the light reflected by the finger cannot pass through the display panel and thus cannot reach the fingerprint recognition unit. As a result, the fingerprint recognition cannot be performed successfully. Therefore, it is an urgent problem to improve the light transmittance of the display panel.

Figure 1A:
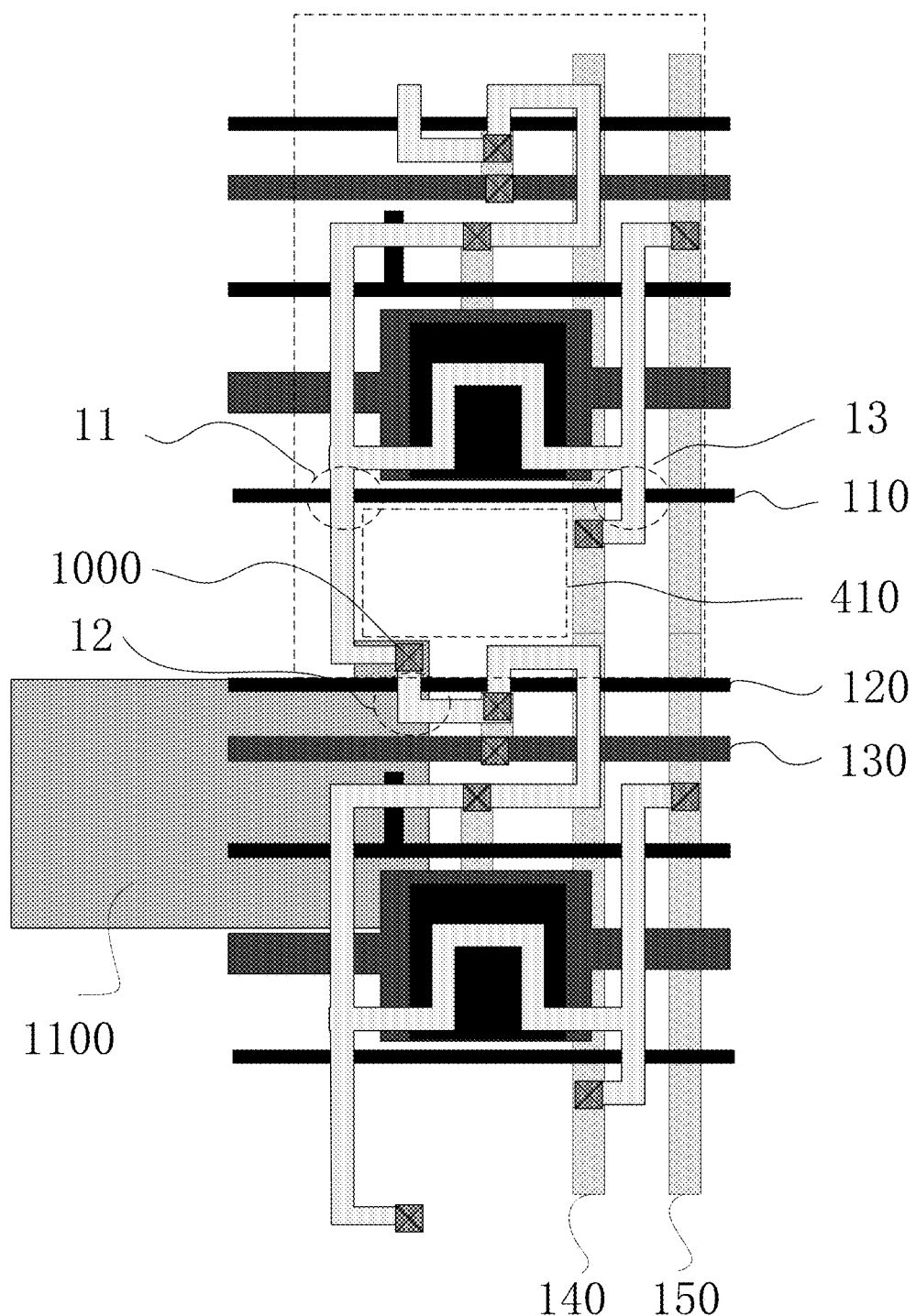
FIG. 1A is a schematic diagram showing a non-light-emitting side of a display panel according to an embodiment of the present disclosure.
Figure 1B:
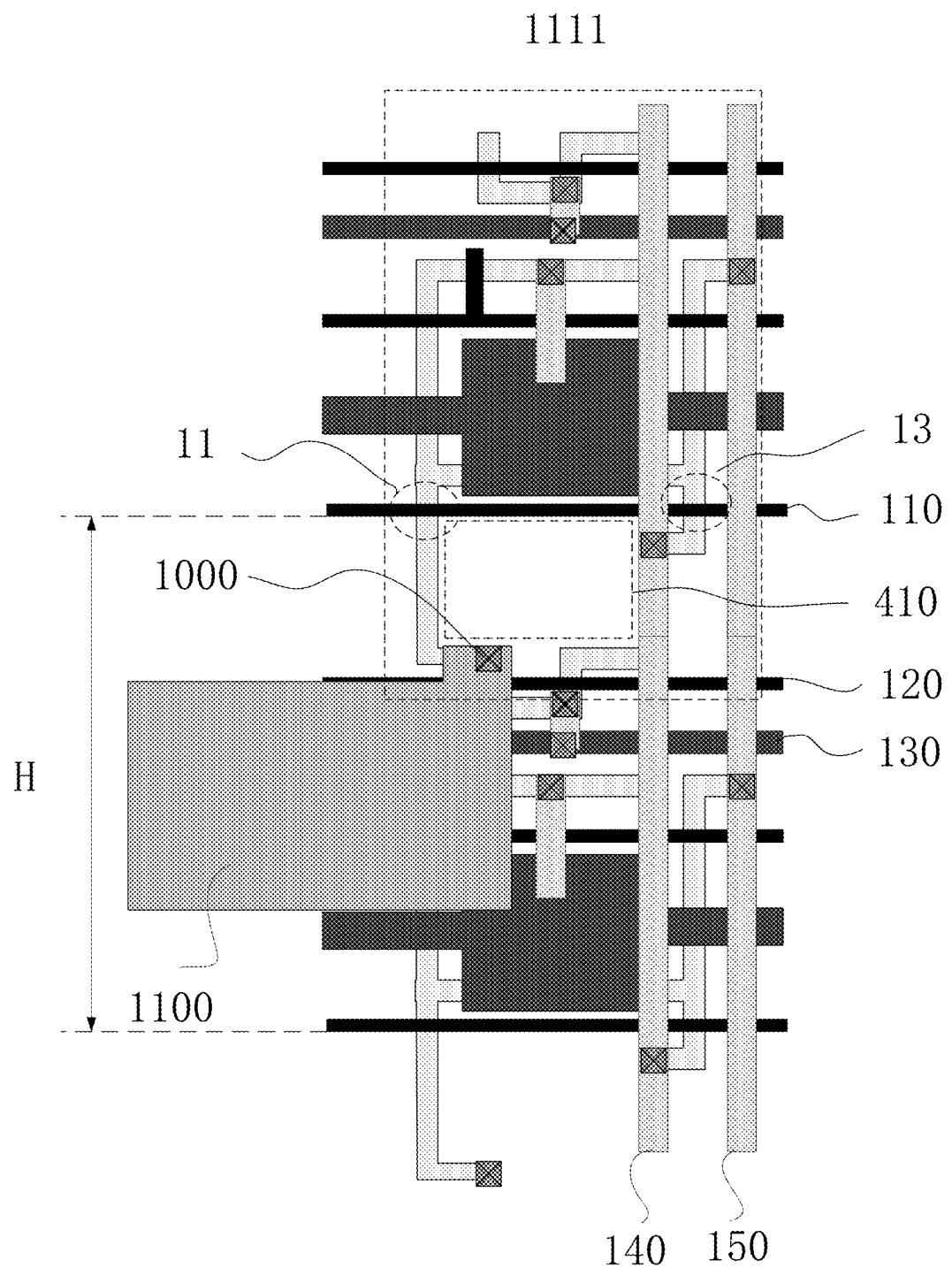
FIG. 1B is a schematic diagram showing a light-emitting side of the display panel according to the embodiment of FIG. 1A.
Figure 1C:
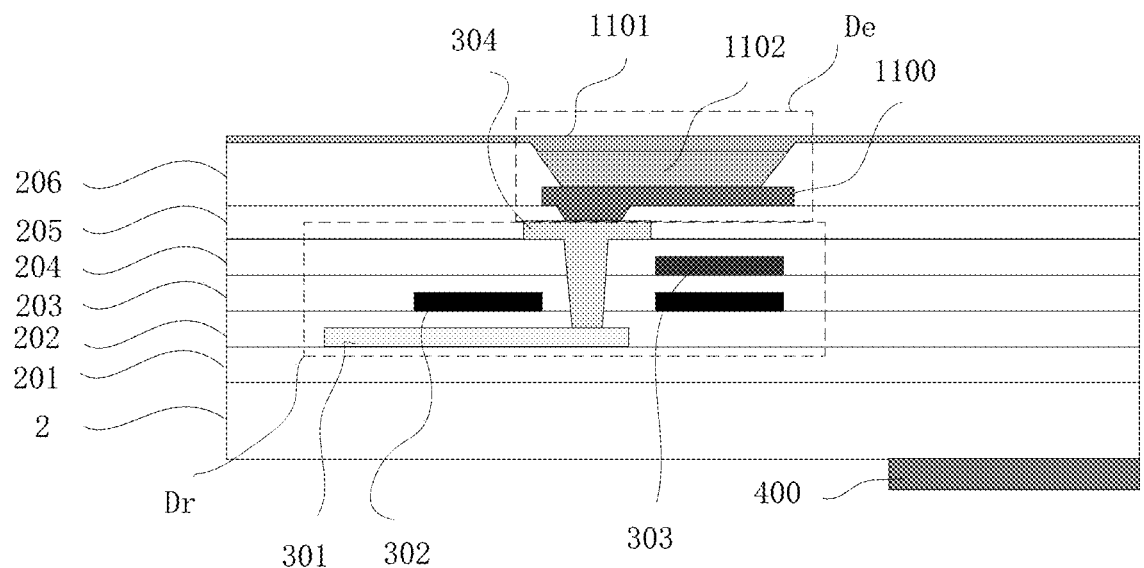
FIG. 1C is a schematic cross-sectional view of the display panel according to the embodiment of FIG. 1A.

FIG. 1A is a schematic diagram showing a non-light-emitting side of a display panel according to an embodiment of the present disclosure. FIG. 1B is a schematic diagram showing a light-emitting side of the display panel according to the embodiment of FIG. 1A. FIG. 1C is a schematic cross-sectional view of the display panel according to the embodiment of FIG. 1A. In the embodiment of the present disclosure, as shown in FIG. 1A, FIG. 1B and FIG. 1C, the display panel includes a driving circuit, a light-emitting device, and a fingerprint recognition unit 400. The light-emitting device includes a first electrode 1100, a second electrode 1101, and an organic function layer 1102 disposed between the first electrode 1100 and the second electrode 1101. For example, the first electrode is an anode and the second electrode is a cathode. The fingerprint recognition unit 400 is disposed at a side of the driving circuit Dr facing away from the light-emitting device De. It should be noted that the light-emitting device herein refers as to an OLED light-emitting unit. In the present disclosure, the fingerprint recognition unit 400 is disposed at a side of the substrate 2 of the display panel facing away from the light-emitting device De, as shown in FIG. 1C. It is also possible that the fingerprint recognition unit 400 is disposed between the substrate 2 and the driving circuit Dr, as long as the fingerprint recognition unit 400 is disposed at the side of the driving circuit Dr facing away from the light-emitting device De.

It should be noted that the driving circuit Dr in the present disclosure refers as to a circuit for driving the light-emitting device De to emit light. The driving circuit Dr includes components for controlling the brightness of the display unit, such as a transistor and a capacitor. The driving circuit Dr includes a light-emitting control transistor 11 and a first initialization transistor 12. The light-emitting control transistor 11 and the first initialization transistor 12 are both connected to the first electrode 1100 via a first through-hole 1000. The light-emitting control transistor is used to control whether the light-emitting unit emits light. During a non-light-emitting period, the light-emitting control transistor 11 is switched off, and current cannot pass through the light-emitting control transistor and thus cannot be transmitted to the first electrode 1100 of the display unit via the through-hole 1000, so that the OLED light-emitting device does not emit light. During a light-emitting period, the light-emitting control transistor is switched on, and the current passes through the light-emitting control transistor and thus is transmitted to the first electrode 1100 via the through-hole 1000, so that the OLED light-emitting device emits light. The first initialization transistor 12 is used to initialize the first electrode 1100. In two frames of display images, the light emitted by a same pixel may have a different brightness. Without the initialization of the first electrode 1100, a data voltage of a previous frame may remain at the first electrode, causing display abnormality. Therefore, the first initialization transistor is switched on in an initialization phase, so that an initialization voltage is transmitted to the first electrode 1100 via the first through-hole to complete the initialization.

The driving circuit Dr includes at least a first driving circuit 1111. In the first driving circuit 1111, a minimum distance between the first through-hole 1000 and a first gate signal line 120 connected to the first initialization transistor is smaller than a minimum distance between the first through-hole and a second gate signal line 110 connected to the light-emitting control transistor. The minimum distance herein represents the minimum distance from the center of the first through-hole 1000 to the gate signal line. In the present disclosure, the fingerprint recognition unit is disposed at the non-light-emitting side of the display panel, so as to achieve the under-screen fingerprint recognition. Thus, the fingerprint recognition unit in the full screen will not occupy the non-display area, thereby achieving a higher screen occupancy ratio. During the fingerprint recognition, the light firstly reaches the finger and is reflected by the finger, and then the light passes through the driving circuit and reaches the fingerprint recognition unit. As shown in FIGS. 1A, 1B and 1C, the filled regions are all opaque regions. It can be seen that the light-transmitting regions are extremely limited, and thus the signal reflected to the fingerprint recognition unit 400 is very weak, resulting in problems such as low signal-to-noise ratio and insensitive fingerprint recognition. In the present disclosure, the first through-hole 1000 is disposed at a position closer to the first gate signal line 120 connected to the first initialization transistor 12, such that the a region enclosed by the light-emitting control transistor 11, the first initialization transistor 12, the second gate signal line 110 connected to the light-emitting control transistor 11, and the first gate signal line 120 connected to the first initialization transistor 12 turns into a light-transmitting region 410 having a relatively large area. In this way, the light reflected in the fingerprint recognition can effectively pass through the display panel and then reach the fingerprint recognition unit, thereby increasing the signal-to-noise ratio and accuracy of the fingerprint recognition.

Figure 2:
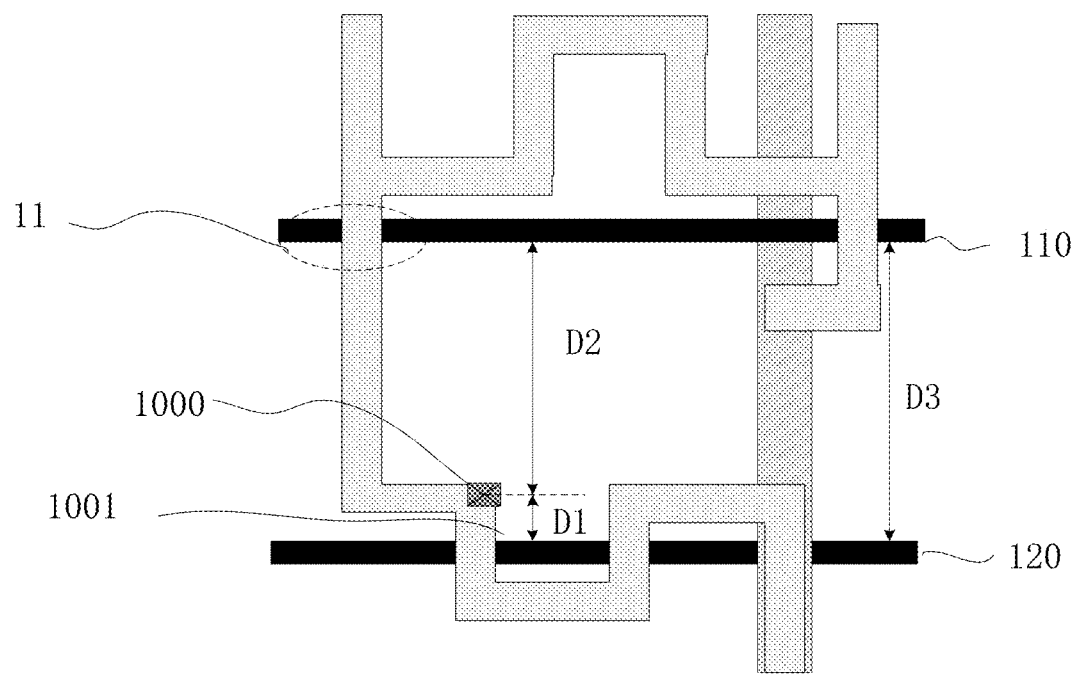
FIG. 2 is a schematic diagram showing a non-light-emitting side of a display panel according to another embodiment of the present disclosure.

FIG. 2 is a schematic diagram showing a non-light-emitting side of a display panel according to another embodiment of the present disclosure. In this embodiment, a distance D3 between the first gate signal line 120 connected to the first initialization transistor and the second gate signal line 110 connected to the light-emitting control transistor is larger than 20% of a distance between pixels and smaller than 25% of the distance between pixels. In this way, on the one hand, the area of the driving circuit of each pixel will not be increased compared with that in the related art, on the other hand, the area of the light-transmitting region can be increased. It should be noted that the distance between pixels in the present disclosure refers as to a distance along a column direction of the display panel (data line 150 direction) between two components having the same function in two adjacent pixel circuits, such as the distance between two second gate signal lines 110 connected to the light-emitting control transistors in two adjacent driving circuits in the column direction, as shown in FIG. 1B.

In the embodiment of the present disclosure as shown in FIG. 2, the minimum distance D1 between the first through-hole 1000 and the first gate signal line 120 connected to the first initialization transistor is larger than 2 μm and smaller than 8% of the distance between pixels. For brevity, in the following description, the first gate signal line 120 connected to the first initialization transistor is referred as SCAN, and the second gate signal line connected to the light-emitting control transistor is referred as EMIT. With reference to FIG. 2, the SCAN and EMIT are located in a gate metal layer 302. The first through-hole 1000 extends from the active layer 301 of the transistor to the first electrode 1100, and it can be seen that the SCAN layer is located between the two layers. If the first through-hole 1000 is too close to the SCAN 120, a short circuit may occur. Therefore, in the present disclosure, the distance between the first through-hole and the SCAN 120 is controlled to be within a range of 2 μm to 8% of the distance between pixels, so that the first through-hole 1000 will not be too far from the SCAN to occupy too much area of the light-transmitting region, and the short circuit risk is avoided at the same time.

With further reference to FIG. 2, if the minimum distance between the first through-hole 1000 and the second gate signal line 110 connected to the light-emitting control transistor is larger than 2.5 μm, i.e., the first through-hole 1000 is disposed at a position away from the second gate signal line 110 connected to the light-emitting control transistor, the parasitic capacitance therebetween can be reduced, thereby avoiding the problem of transparent sub-pixel. In an OLED display, it is possible to reduce a duty ratio of the light-emitting control signal, in order to reduce the brightness. That is, during one frame of image display, the light-emitting control transistor 11 is repeatedly switched on and off for many times, so that a total light-emitting time is relatively shorter, the accumulated brightness reaching the human eye is reduced, and thus the displayed image looks like darker. In this mode, the light-emitting control signal of the second gate signal line 110 connected to the light-emitting control transistor 11 is frequently switched between a high level and a low level. For example, in a PMOS type pixel circuit, when the signal of the second gate signal line connected to the light-emitting control transistor jumps to a high level from a low level, the transistor should be switched off to stop emitting light from the light-emitting device. However, due to the parasitic capacitance, the potential from the low level to the high level is coupled to the first electrode, which results in a higher potential of the first electrode, when a potential difference between the first electrode and the second electrode reaches a threshold of light emission of the light-emitting device, the light-emitting device will emit light under a condition that light-emitting is undesired. The first through-hole 1000 is arranged at a position away from the second gate signal line 110 connected to the light-emitting control transistor, so as to reduce the parasitic capacitance therebetween and avoid the problem of undesired light-emitting.

In the embodiment of the present disclosure as shown in FIG. 1A and FIG. 1B, the first electrode 1100 connected to the first driving circuit is disposed at a side of the first through-hole 1000 close to the first initialization transistor 12. In combination with FIG. 1A and FIG. 1B, a straight line passing the first through-hole 1000 along a direction parallel to the gate signal line 110 divides the panel into two portions. The first electrode 1100 is disposed in a portion closer to the first initialization transistor 12. In the present disclosure, the first electrode 1100 is a totally reflective opaque electrode. Therefore, if the first electrode is close to the light-emitting control transistor 11, the overall light-transmitting region will be blocked and thus the light is blocked. For this reason, the first electrode 1100 is disposed at the side close to the first initialization transistor 12, which can greatly increase the area of the light-transmitting region of the display panel, thereby increasing the light transmittance of the display panel and improving the accuracy of fingerprint recognition.

Figure 3A:
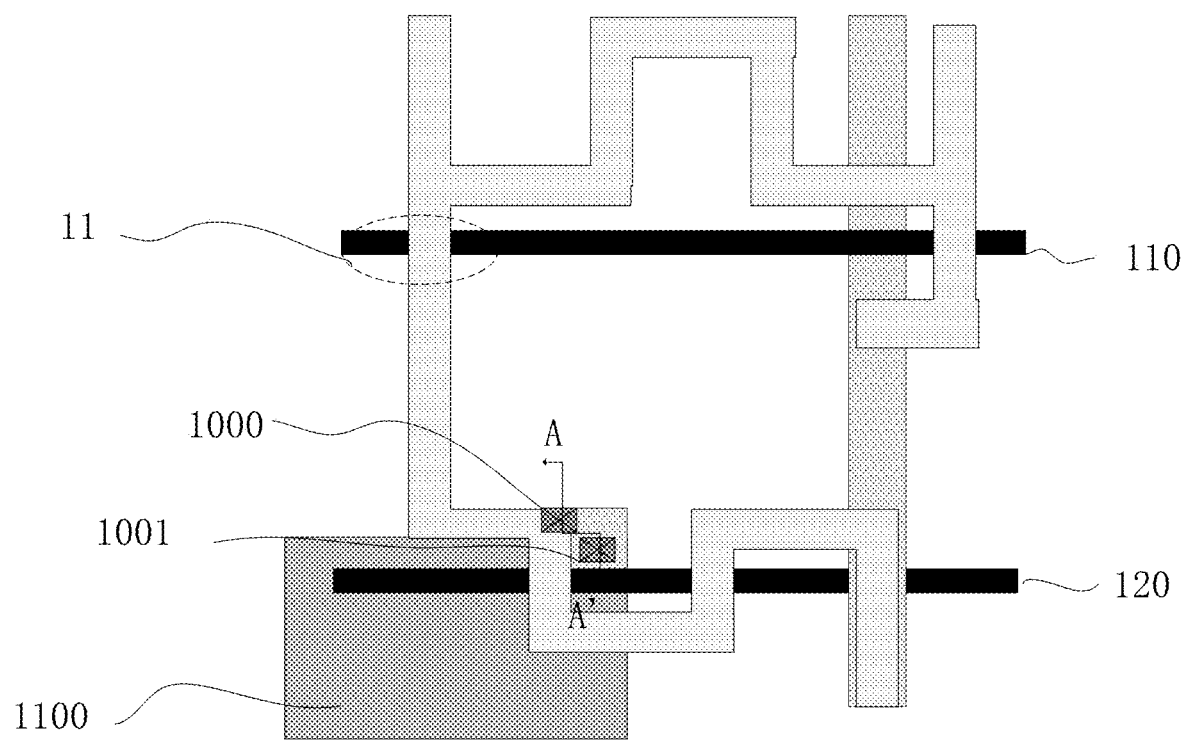
FIG. 3A is a schematic diagram showing a non-light-emitting side of a display panel according to still another embodiment of the present disclosure.
Figure 3B:
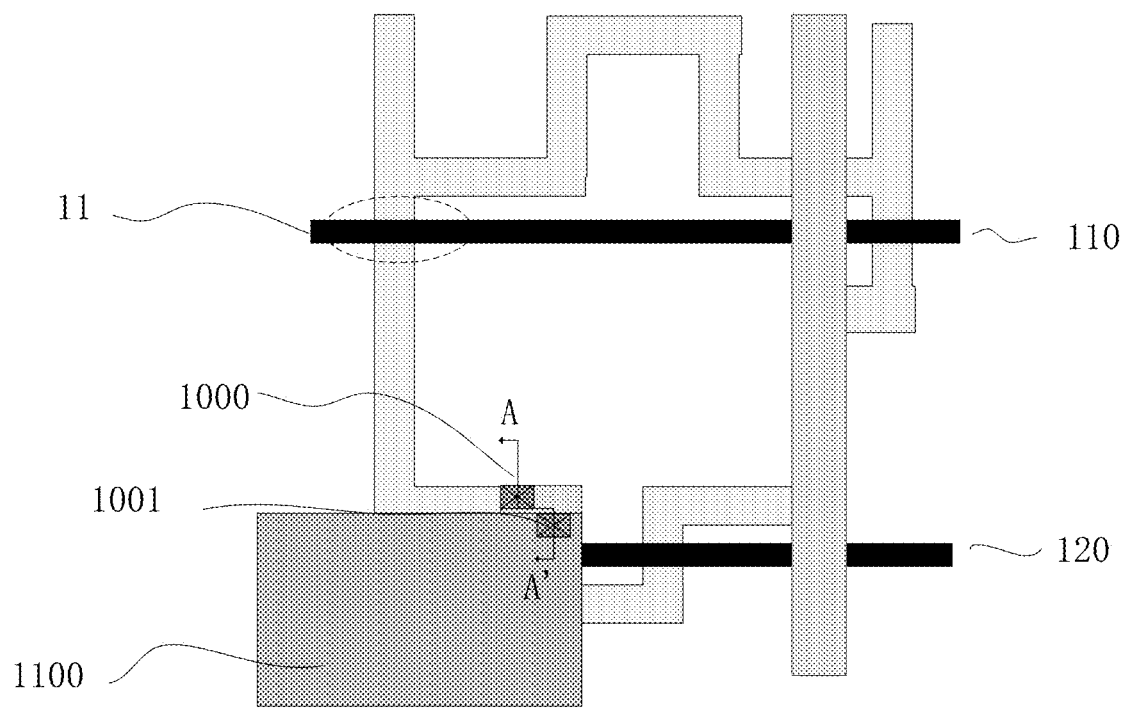
FIG. 3B is a schematic diagram showing a light-emitting side of the display panel according to the embodiment of FIG. 3A.
Figure 3C:
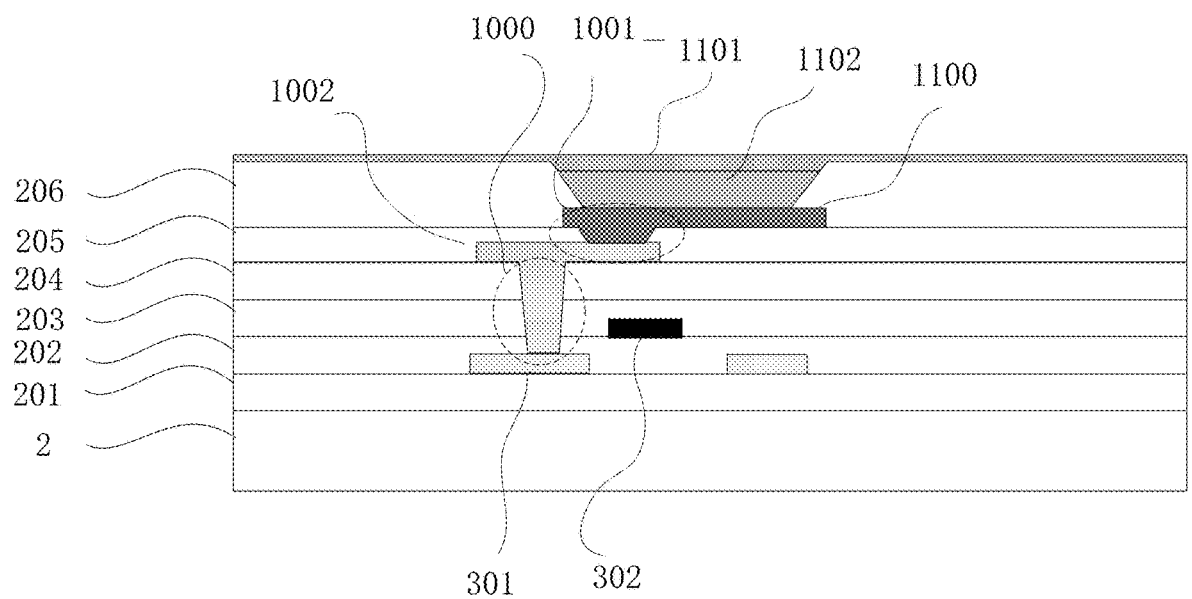
FIG. 3C is a schematic cross-sectional view along AA' of the display panel according to the embodiment of FIG. 3A.

FIG. 3A is a schematic diagram showing a non-light-emitting side of a display panel according to still another embodiment of the present disclosure. FIG. 3B is a schematic diagram showing a light-emitting side of the display panel according to the embodiment of FIG. 3A. FIG. 3C is a schematic cross-sectional view along AA' of the display panel according to the embodiment of FIG. 3A. In the embodiment as shown in FIG. 3A, FIG. 3B and FIG. 3C, the first driving circuit is connected to a first pad layer 1002 via the first through-hole 1000. The first pad layer 1002 is connected to the first electrode 1100 via a second through-hole 1001. The second through-hole 1001 is disposed at a side of the first through-hole 1000 close to the first gate signal line 120 connected to the first initialization transistor. Between the active layer 301 and the first electrode 1100, the OLED driving circuit further includes a gate metal layer 302, a capacitor metal layer (not shown), and a source-drain metal layer. There are four insulation layers between the active layer 301 and the first electrode 1100, i.e., a gate insulation layer 202 between the active layer 301 and the gate metal layer 302, a first interlayer insulation layer 203 between the capacitor metal layer and the gate metal layer 302, a second interlayer insulation layer 204 between the capacitor metal layer and the source-drain metal layer 1002, and a planarization layer 205 between the source-drain metal layer and the first electrode 1100. The gate metal layer, the first interlayer insulation layer and the second interlayer insulation layer are generally relatively thin inorganic layers. The planarization layer is generally a relatively thick organic layer. If the through-hole of each layer is etched separately, there may be a problem that the through-holes of those layers may be misaligned. If the through-holes of these four layers are etched together, the etching may be incomplete due to the thick layers and different materials. With the first pad layer 1002, the connection can be achieved as long as all of the through-holes overlap the first pad layer 1002. Since the first pad layer 1002 has a relatively large area, the through-holes only need to fall within the range of the first pad layer 1002, but unnecessary to be aligned. In this way, the requirement on the etching precision is greatly lowered. Moreover, the first pad layer is disposed between two layers of the gate metal layer, the first interlayer insulation layer, the second interlayer insulation layer, and the planarization layer. The through-holes of four layers are divided into two parts (i.e., the through-hole above the first pad layer and the through-holes under the first pad layer), thereby avoiding the problem of incomplete etching due to the too thick film layer. In the present disclosure, the first pad layer 1002 is connected via the first through-hole 1000, and the first electrode 1100 is connected via the second through-hole 1001. For example, the through-holes are divided into two parts, i.e., first through-holes, which are inorganic layer through-holes, and second through-hole, which is an organic layer through-hole. The first through-holes can be etched together, or two of them are etched together, and the other one is etched separately, so as to solve the problem that the through-holes cannot be etched. Moreover, in an embodiment, the second through-hole is disposed at a position close to the SCAN, which can prevent the second through-hole from occupying the light-transmitting region, thereby further increasing the light transmittance and improving the accuracy of fingerprint recognition.

The display panel shown in FIG. 3C further includes a pixel definition layer 206 disposed between the first electrode 1100 and the second electrode 1101. The pixel definition layer 206 is provided with a plurality of openings, in which the organic functional layer 1102 is arranged.

With further reference to FIG. 3A, FIG. 3B and FIG. 3C, the first pad layer 1002 and the first gate signal line 120 connected to the first initialization transistor are disposed in different layers, and the first pad layer 1002 at least partially overlaps the first gate signal line 120 connected to the first initialization transistor. The first pad layer 1002 should be electrically connected to the first electrode via the through-hole so as to transmit the signal to the first electrode. In order to prevent the connection between the first pad layer 1002 and the first electrode 1100 from occupying the light-transmitting region, the first pad layer 1002 and the SCAN (302 in FIG. 3C) are disposed in different layers, and the first pad layer 1002 overlaps the SCAN, so that the opaque region is occupied, thereby occupying the light-transmitting region as less as possible, and thus improving the light transmittance and the accuracy of fingerprint recognition.

With further reference to FIG. 1A and FIG. 1B, the driving circuit further includes an initialization signal line 130, the initialization signal line 130 is parallel to the first gate signal line 120 connected to the first initialization transistor, and the initialization signal line 130 is disposed at a side of the first gate signal line 120 connected to the first initialization transistor away from the first through-hole 1000. The initialization signal line is configured to provide an initialization voltage for the first initialization transistor 12. The initialization signal line 130 is disposed at the side away from the first through-hole 1000 to prevent the initialization signal line 130 from occupying the light-transmitting region, which is advantageous for improving the transmittance ratio of the display panel and improving the fingerprint recognition precision.

Figure 4A:
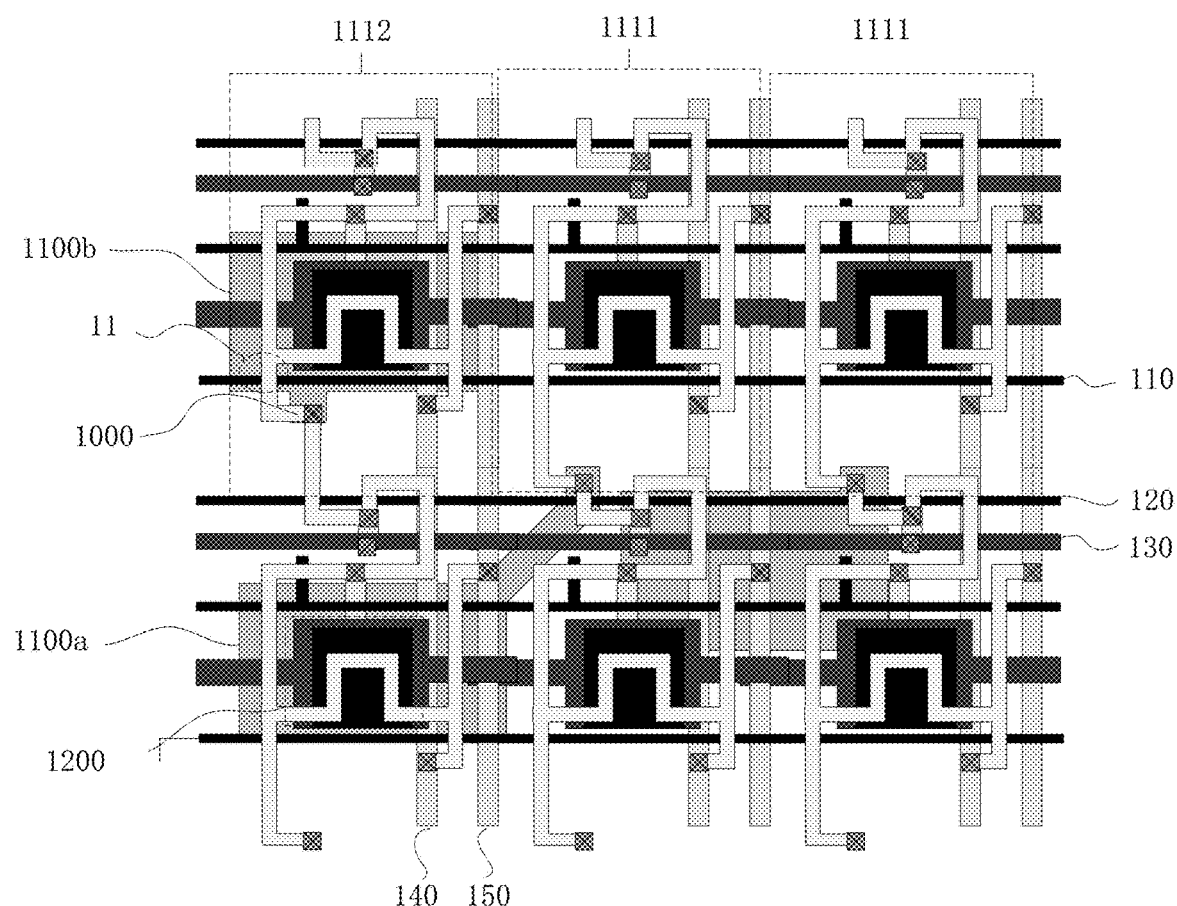
FIG. 4A is a schematic diagram showing a non-light-emitting side of a display panel according to still another embodiment of the present disclosure.
Figure 4B:
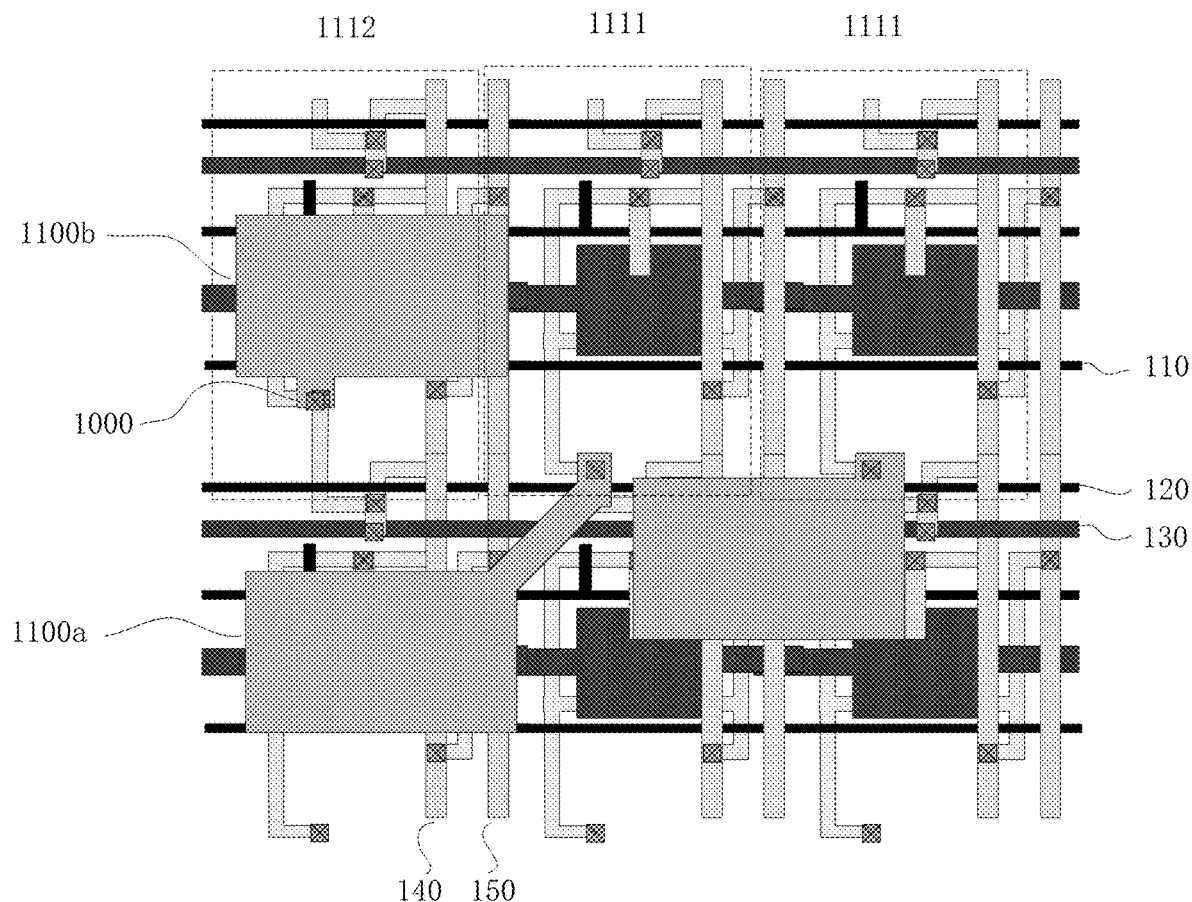
FIG. 4B is a schematic diagram showing a light-emitting side of the display panel according to the embodiment of FIG. 4A.

FIG. 4A is a schematic diagram showing a non-light-emitting side of a display panel according to yet another embodiment of the present disclosure. FIG. 4B is a schematic diagram showing a light-emitting side of the display panel according to the embodiment of FIG. 4A, where three adjacent driving circuits along an extending direction of the gate signal line 110 are shown. The three adjacent driving circuits include at least two first driving circuits 1111. In the OLED display panel, since each sub-pixel needs to be driven by one pixel circuit and each driving circuit occupies a relatively large area, it is difficult to achieve a high PPI (Pixels Per Inch). Currently, a method for achieving a high PPI is a method of rendering pixels. In an arrangement of rendered pixels, the first electrodes of some sub-pixels do not overlap the corresponding driving circuit. In this embodiment of the display panel, it is unnecessary to require that the first electrodes of all the sub-pixels overlap the corresponding driving circuit, so that layout requirement of the arrangement of rendered pixels can be satisfied, thereby achieving the fingerprint recognition of a high PPI display panel.

Further, in the embodiment shown in FIG. 4A and FIG. 4B, the three adjacent driving circuits along the extending direction of the second gate signal line 100 connected to the light-emitting control transistor includes a second driving circuit 1112. The first electrode 1100b connected to the second driving circuit 1112 is disposed at a side of the first through-hole 1000 close to the light-emitting control transistor. In the second driving circuit, a minimum distance between the first through-hole of and the second gate signal line 110 connected to the light-emitting control transistor is smaller than a minimum distance between the first through-hole and the first gate signal line 120 connected to the first initialization transistor. In this embodiment, the three adjacent driving circuits include two first driving circuits 1111 and one second driving circuit 1112. The first electrode 1100a of the first driving circuit 1111 is disposed at a side of the first through-hole close to the first initialization transistor, and the first electrode 1100b of the second driving circuit 1112 is disposed at a side of the first through-hole close to the light-emitting control transistor. If the first electrodes of the three pixels are all disposed at the side of the first through-hole close to the first initialization transistor, applying such layout to the arrangement of rendered pixel will cause that the first electrode of one pixels blocks the light-transmitting region, and thus the overall light transmittance ratio of the display panel is reduced by approximately one-third. The arrangement according to this embodiment, in combination with the layout of the rendered pixels, the light transmittance of the display panel can be maximized, thereby improving the accuracy of fingerprint recognition.

Further, in the second driving circuit 1112, the minimum distance between the first through-hole 1000 and the second gate signal line 110 connected to the light-emitting control transistor is larger than 2.5 µm and smaller than 8% of the distance between pixels. In the second driving circuit 1112, on the one hand, the first through-hole needs to be as close as possible to the EMIT signal line, so as to increase the light transmittance of the display panel. On the other hand, when the first through-hole is too close to the EMIT signal line, the parasitic capacitance may be too great, which may affect the display effect when the EMIT signal is switched between a high level and a low level, thereby causing the sub-pixels to be light transmissible. After a large amount of experiments, the inventor has found that, when the minimum distance between the first through-hole 1000 and the second gate signal line 110 connected to the light-emitting control transistor is within a range of 2.5 µm to 8% of the distance between pixels, the undesired light-emitting will not occur, and the transmittance is significantly increased.

Further, the driving circuit further includes a storage capacitor 1200, which is covered by at least one first electrode 1100. In an embodiment, two electrode plates of the storage capacitor 1200 are made by a gate metal layer and a capacitor metal layer, respectively, which are both opaque film layers. The first electrode 1100 in a top-emitting OLED is a totally reflective anode and is also opaque. In the display panel provided with the fingerprint recognition unit, the area of the first electrode should not be reduced, in order to guarantee the area of the light-emitting region. In order to ensure the stability of the light-emitting signal, the area of the capacitor cannot be reduced. In this embodiment, the opaque regions overlap each other, while the remaining region is used for the light-transmitting region, so that the light transmittance of the display panel is further increased, thereby improving the accuracy of fingerprint recognition.

Figure 5:
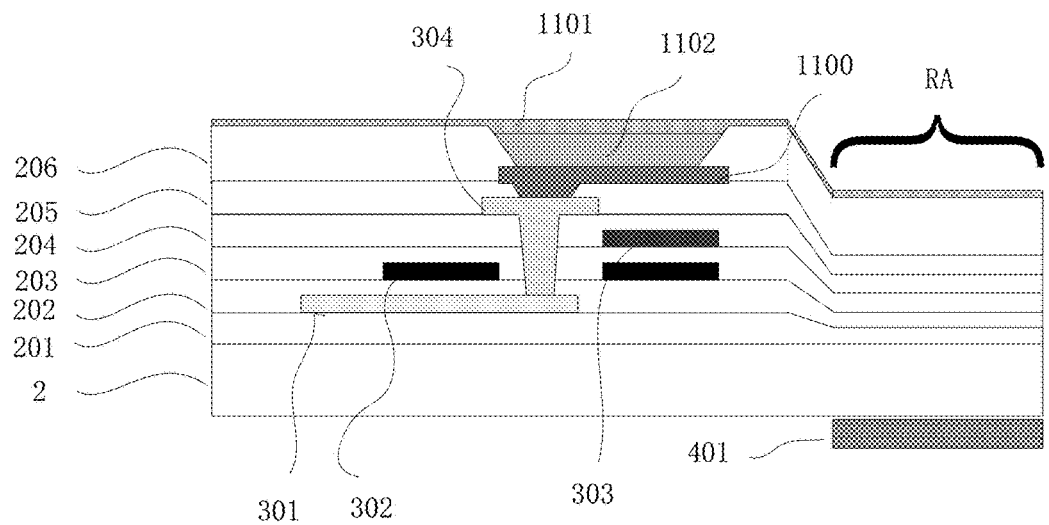
FIG. 5 is a schematic cross-sectional view of a display panel according to yet another embodiment of the present disclosure.
Figure 6B:
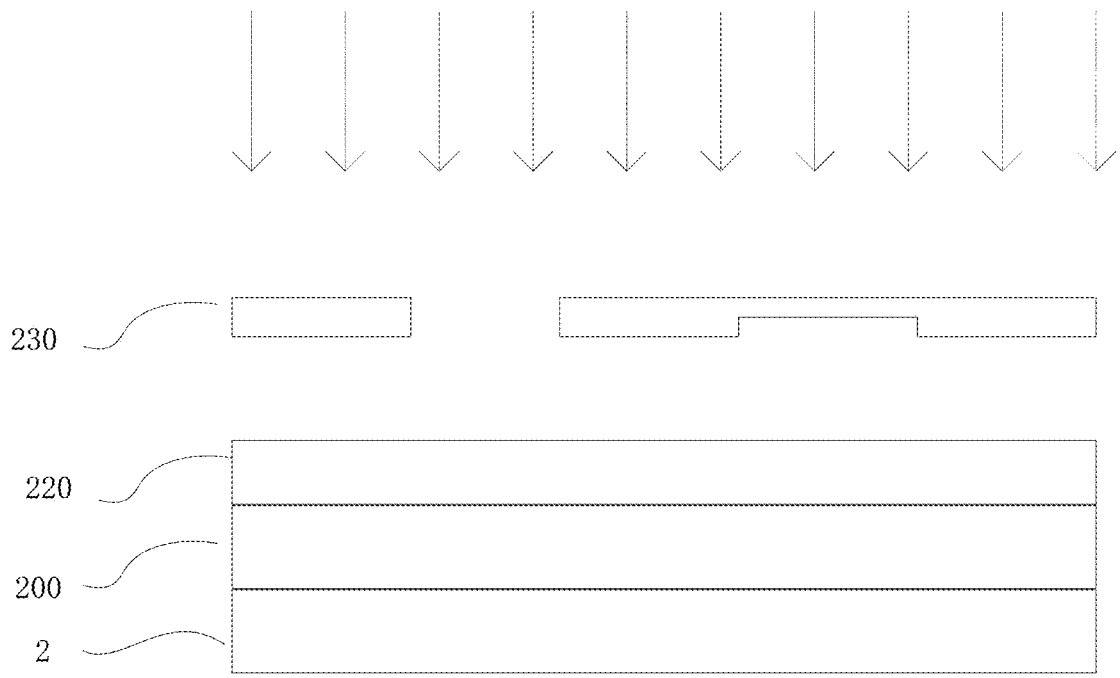
Figure 6C:
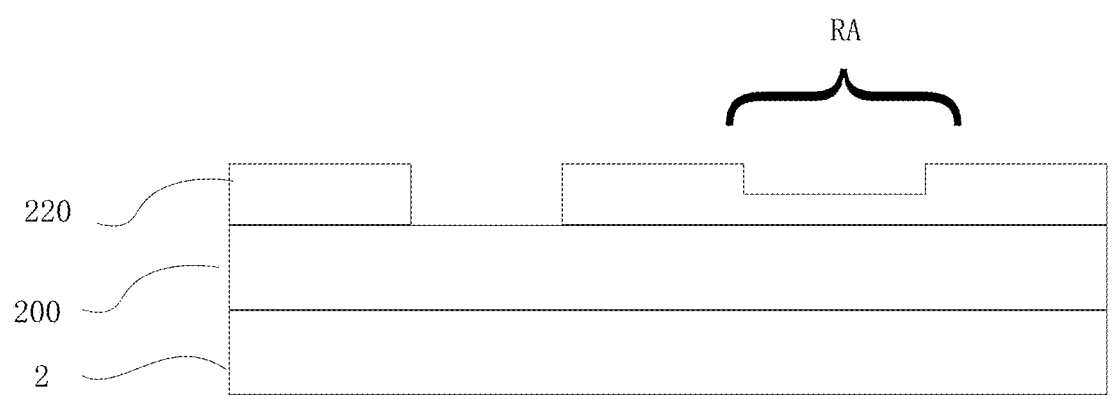
Figure 6D:
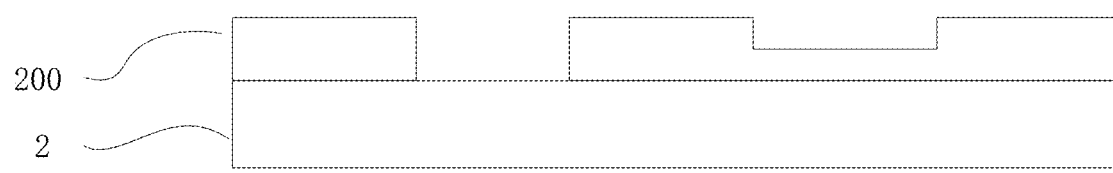

FIG. 5 is a schematic cross-sectional view of a display panel according to another embodiment of the present disclosure. In the embodiment shown in FIG. 5, the fingerprint recognition unit includes a photosensitive region 401. The driving circuit further includes an inorganic layer including a thinned region RA and a non-thinned region. The thinned region has a smaller thickness than the non-thinned region. The thinned region RA at least partially overlaps the photosensitive region 401. In this embodiment, the display panel further includes some inorganic layers for insulation. Although the inorganic layer is transparent, light will still be absorbed, reflected and refracted when passing through the inorganic layer, thereby causing a light loss and a change of optical path. As a result, the light reaching the photosensitive region of the fingerprint recognition unit is weakened. In this embodiment, the inorganic layer is thinned to reduce light absorption. In this way, even if light refraction occurs, the deviation is not severe due to the short optical path. When the thinned region RA at least partially overlaps the photosensitive region 401, the light brightness received by the photosensitive region can be effectively improved.

With further reference to FIG. 5, the driving circuit includes an active layer 301, a gate metal layer 302, and a source-drain metal layer 304 sequentially disposed on the substrate 2. The inorganic layer includes a buffering layer 201, a gate insulation layer 202, and an interlayer insulation layer. The buffering layer 201 is disposed between the substrate 2 and the active layer 301. The gate insulation layer 202 is disposed between the active layer 301 and the gate metal layer 302. The interlayer insulation layer is disposed between the gate metal layer 302 and the source-drain metal layer 304. The thinned region is disposed in at least one of the buffering layer, the gate insulation layer, and the interlayer insulation layer.

Further, a capacitor metal layer 303 is further disposed between the gate metal layer 302 and the source-drain metal layer 304. The interlayer insulation layer includes a first interlayer insulation layer 203 disposed between the gate metal layer 302 and the capacitor metal layer 303, and a second interlayer insulation layer 204 disposed between the capacitor metal layer 303 and the source-drain metal layer 304.

All of the abovementioned inorganic layers can be thinned or only a part of the abovementioned inorganic layers is thinned. The amount of light passing through is maximized and the angle change is minimized by matching the thickness and the refractive index of the inorganic layer, thereby effectively improving the transmitting efficiency of the reflected light in the light-transmitting layer of the fingerprint recognition, so that the photosensitive region of the fingerprint recognition unit can receive more light to improve the accuracy of fingerprint recognition.

Further, the thinned region RA does not overlap the transistor or the storage capacitor in the driving circuit. Thinning of the inorganic layer may influence the performance of the transistor. For example, thinning of the gate insulation layer causes changes in parameters (such as the threshold value) of the transistor, resulting in display abnormality. Moreover, the transistor may be more easily broken due to the thinning of the gate insulation layer. Therefore, the inorganic layer should not be thinned at the position where the transistor is provided. Similarly, the thinning will influence the capacitance of the capacitor at the position where the capacitor is provided, thereby resulting in display abnormality. In this embodiment, the thinned region does not overlap the transistor or the storage capacitor. In other words, the transistor and the storage capacitor are disposed in the non-thinned region, such that the parameters of the transistor and capacitor are not affected by the thinning of the inorganic layer, thereby avoiding the above problem.

With reference to FIG. 2 and FIG. 1A, the driving circuit further includes a power voltage input transistor 13, and the power voltage input transistor is connected to a power voltage signal 140. In the driving circuit of the OLED pixel, the power voltage input transistor is configured to keep powering a power voltage to the driving circuit during the light-emitting stage. The power voltage is supplied to the driving transistor to generate a driving current, which finally flows to the light-emitting device through the light-emitting control transistor.

The first gate signal line 120 connected to the first initialization transistor, the second gate signal line 110 connected to the light-emitting control transistor, the power voltage signal line 140, and the active layer of the first initialization transistor 12 and the light-emitting control transistor 11 define a first light-transmitting region 410. Here, this expression "define" means enclosing a light-transmitting region.

The first light-transmitting region 410 at least partially overlaps the photosensitive region 401. The thinned region RA is included in the first light-transmitting region 410. In this embodiment, the thinned region, the first light-transmitting region and the photosensitive region overlap in a direction perpendicular to the display panel, so that the photosensitive region of the fingerprint identifying unit directly faces the first light-transmitting region 410 which is enlarged by applying the abovementioned design. Moreover, the inorganic layer of the first light-transmitting region 410 is thinned so as to reduce the absorption and deflection of light, so that the photosensitive region of the fingerprint recognition unit can more effectively receive the light passing through the first light-transmitting region 410.

FIGS. 6A-6D are schematic diagrams showing a process of manufacturing a display panel according to an embodiment of the present disclosure. The method of this embodiment is used to manufacture a display panel having an inorganic layer including a thinned region.

S101: the inorganic layer is manufactured by vapor deposition. The inorganic layer 200 is manufactured on the substrate 2 by vapor deposition, such as chemical vapor deposition CVD.

S102: a photoresist 220 is coated, and exposed by a halftone mask 230. A semi-light-transmitting region of the halftone mask corresponds to the thinned region RA. The halftone mask includes opaque region and semi-light-transmitting region in addition to a light-transmitting region. For example, when the photoresist is positive, the opaque region and the light-transmitting region correspond to a non-etching region and a full-etching region, respectively. The semi-light-transmitting region corresponds to the thinned region, that is, partial exposure is performed. It should be noted that the photoresist may also be negative, which is not limited herein by the present disclosure.

S103: Development of a developing solution. The partially exposed photoresist 220 is developed with the developing solution, where the photoresist in the full-etching region is washed away, the photoresist in the non-etching area is remained, and the photoresist in the thinned region is partially washed away.

S104: the photoresist is etched and removed, and a thinned region is formed in the inorganic layer. During the etching process, the etching liquid penetrates the inorganic layer 200 in the full-etching region, the inorganic layer 200 in the non-etching area is not etched due to the protection of the thick photoresist, and the thinner photoresist in the thinned region RA is firstly etched away by the etching liquid, and then the etching liquid further etches a part of the inorganic layer, so as to form the thinned region RA of the inorganic layer.

Figure 7:
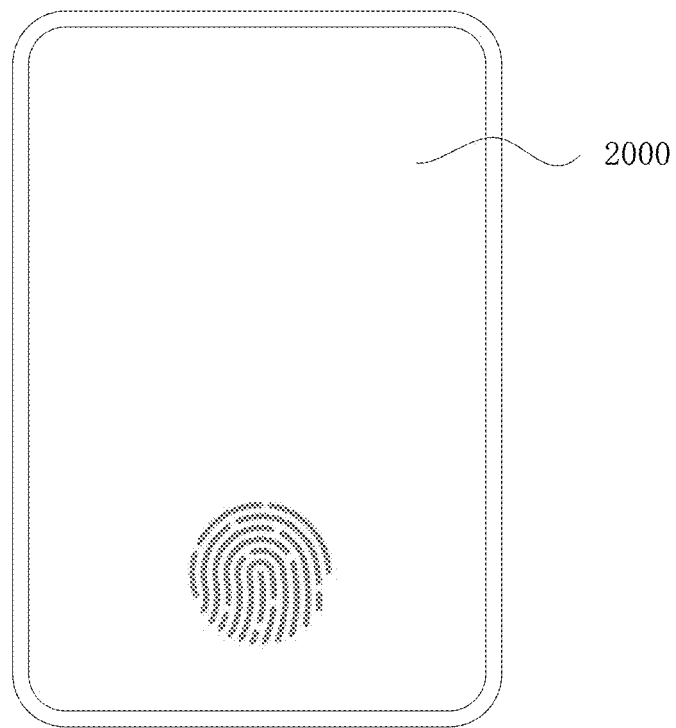
FIG. 7 is a schematic diagram of a display apparatus according to an embodiment of the present disclosure.

The present disclosure further provides a display apparatus. The fingerprint recognition unit of the display apparatus includes a fingerprint recognition sensor. As shown in FIG. 1C, the fingerprint recognition sensor is attached to the non-light-emitting side of the display panel. The display apparatus of the present disclosure may be any device including the driving unit as described above, including but not limited to a mobile phone 2000 as shown in FIG. 7, a tablet computer, a displayer of a computer, a displayer of a smart wearable device, a display apparatus of vehicles such as a car, etc. The display apparatus, which includes the driving unit included in the display apparatus according to the present disclosure, is considered to fall within the protection scope of the present disclosure.

The above-described embodiments are merely preferred embodiments of the present disclosure and are not intended to limit the present disclosure. Any modifications, equivalent substitutions and improvements made within the principle of the present disclosure shall fall into the protection scope of the present disclosure.

What is claimed is:

1. A display panel, comprising:
a plurality of driving circuits;
a plurality of light-emitting devices; and
a fingerprint recognition unit disposed at a side of the plurality of driving circuits facing away from the plurality of light-emitting devices,
wherein each of the plurality of light-emitting devices comprises a first electrode, a second electrode, and an organic function layer disposed between the first electrode and the second electrode,
the first electrode is a reflective electrode,
each of the plurality of driving circuits comprises a light-emitting control transistor and a first initialization transistor, each of the plurality of driving circuits is provided with a first through hole, and the light-emitting control transistor and the first initialization transistor are connected to the first electrode via the first through-hole;
each of the plurality of driving circuits comprises a first driving circuit, and in the first driving circuit of one of the plurality of driving circuits, a minimum distance between a first through-hole of the first driving circuit and a first gate signal line connected to the first initialization transistor of the one driving circuit is smaller than a minimum distance between the first through-hole of the first driving circuit and a second gate signal line connected to the light-emitting control transistor of the one driving circuit,
the display panel is an organic light-emitting diode (OLED) display panel,
the first electrode connected to the first driving circuit is disposed at a side of the first through-hole close to the first initialization transistor, and
each of the plurality of the driving circuits further comprises an initialization signal line, the initialization signal line is disposed at a side of the first gate signal line connected to the first initialization transistor away from the first through-hole.

2. The display panel according to claim 1, wherein a distance between the first gate signal line connected to the first initialization transistor and the second gate signal line connected to the light-emitting control transistor is 20%-25% of a distance between pixels.

3. The display panel according to claim 2, wherein the minimum distance between the first through-hole and the first gate signal line connected to the first initialization transistor is larger than 2 μm and less than 8% of the distance between pixels.

4. The display panel according to claim 2, wherein a minimum distance between the first through-hole and the second gate signal line connected to the light-emitting control transistor is greater than 2.5 μm.

5. The display panel according to claim 1, wherein the first driving circuit is connected to a first pad layer via the first through-hole, the first pad layer is connected to the first electrode via a second through-hole, and the second through-hole is disposed at a side of the first through-hole close to the first gate signal line connected to the first initialization transistor.

6. The display panel according to claim 5 wherein the first pad layer and the first gate signal line connected to the first initialization transistor are disposed in different layers, and the first pad layer at least partially overlaps the first gate signal line connected to the first initialization transistor.

7. The display panel according to claim 1, wherein the initialization signal line is parallel to the first gate signal line connected to the first initialization transistor.

8. The display panel according to claim 1, wherein three adjacent driving circuits of the plurality of driving circuits disposed along an extending direction of the first gate signal line connected to the first initialization transistor comprise at least two first driving circuits.

9. The display panel according to claim 8, wherein the three adjacent driving circuits comprise one second driving circuit, the first electrode connected to the second driving circuit is disposed at a side of the first through-hole close to the light-emitting control transistor, and a minimum distance between a first through-hole of the second driving circuit and the second gate signal line connected to the light-emitting control transistor is smaller than a minimum distance between the first through-hole and the first gate signal line connected to the first initialization transistor.

10. The display panel according to claim 9, wherein in the second driving circuit, the minimum distance between the first through-hole and the second gate signal line connected to the light-emitting control transistor is greater than 2.5 μm and less than 8% of a distance between pixels.

11. The display panel according to claim 8, wherein each of the plurality of driving circuits further comprises a storage capacitor covered by at least one first electrode.

12. The display panel according to claim 1, wherein the fingerprint recognition unit comprises a photosensitive region, each of the plurality of driving circuits further comprises an inorganic layer comprising a thinned region and a non-thinned region, the thinned region has a smaller thickness than the non-thinned region, and the thinned region at least partially overlaps the photosensitive region.

13. The display panel according to claim 12, wherein the thinned region neither overlaps the transistor nor the storage capacitor of each of the plurality of driving circuits.

14. The display panel according to claim 12, wherein each of the plurality of driving circuits comprises an active layer, a gate metal layer and a source-drain metal layer which are sequentially disposed on a substrate;

the inorganic layer comprises a buffering layer, a gate insulation layer, and at least one interlayer insulation layer, wherein the buffering layer is disposed between the substrate and the active layer, the gate insulation layer is disposed between the active layer and the gate metal layer, the at least one interlayer insulation layer is disposed between the gate metal layer and the source-drain metal layer, and at least one of the buffering layer, the gate insulation layer, and the at least one interlayer insulation layer is provided with the thinned region.

15. The display panel according to claim 14, wherein a capacitor metal layer is further disposed between the gate metal layer and the source-drain metal layer;

the at least one interlayer insulation layer comprises a first interlayer insulation layer disposed between the gate metal layer and the capacitor metal layer and a second interlayer insulation layer disposed between the capacitor metal layer and the source-drain metal layer.

16. The display panel according to claim 13, wherein each of the plurality of driving circuits further comprises a power voltage input transistor connected to a power voltage signal line, a first light-transmitting region is defined by the first gate signal line connected to the first initialization transistor, the second gate signal line connected to the light-emitting control transistor, the power voltage signal line, and the active layer of the first initialization transistor and the light-emitting control transistor.

17. The display panel according to claim 16, wherein the first light-transmitting region at least partially overlaps the photosensitive region, and the first light-transmitting region comprises the thinned region.

18. A display apparatus, comprising the display panel according to claim 1, wherein the fingerprint recognition unit comprises a fingerprint recognition sensor, and the fingerprint recognition sensor is attached to a non-light-emitting side of the display panel.

19. A display apparatus, comprising the display panel according to claim 2, wherein the fingerprint recognition unit comprises a fingerprint recognition sensor, and the fingerprint recognition sensor is attached to a non-light-emitting side of the display panel.

* * * * *